United States Patent [19]

Blondeau et al.

[11] Patent Number: 4,901,321
[45] Date of Patent: Feb. 13, 1990

[54] OPTICAL WAVEGUIDE MADE SOLID STATE MATERIAL LASER APPLYING THIS WAVEGUIDE

[75] Inventors: Robert Blondeau, Ablis; Yannic Bourdin, Antony; Beaudoin de Cremoux, Orsay; Michel Papuchon; Michel Krakowsky, both of Paris; Alain Bensoussan, Toulouse; Manijeh Razeghi, Orsay; Francoise Lozes, Castanet, all of France

[73] Assignee: Thomson-CSF, Paris, France

[21] Appl. No.: 31,954

[22] Filed: Mar. 30, 1987

[30] Foreign Application Priority Data

Mar. 28, 1986 [FR] France ................. 86 04523

[51] Int. Cl.⁴ ............................................. H01S 3/30
[52] U.S. Cl. .......................................... 372/7; 372/45; 350/96.11; 350/96.12
[58] Field of Search .................... 372/45, 7, 46; 350/96.11, 96.12, 96.29, 96.34

[56] References Cited

U.S. PATENT DOCUMENTS 4,694,460 9/1987 Hayakawa et al. .................. 372/45

FOREIGN PATENT DOCUMENTS 0002827 7/1979 European Pat. Off.
0081956 6/1983 European Pat. Off.
0114109 7/1984 European Pat. Off.
0166593 1/1986 European Pat. Off.

OTHER PUBLICATIONS

Blondeau et al; "CW Operation . . . Grown by LP-MOCVD"; Electronics Letter vol. 20, No. 21; 10/1984; pp. 850-851.
Okamoto et al.; "InGaAsP . . . Electroabsorption"; J. Appl. Phys. 56(g), Nov. 1, 1984; pp. 2595-2596.
Ohke et al; "Optical Waveguides . . . Quantum Well"; Optics Communications vol. 56, No. 4; 12/15/1985; pp. 235-239.
Blondeau et al; "Hot Electron Spectroscopy"; Electronics Letter vol. 20, No. 21; 10/1984; pp. 851-852.

Primary Examiner—Frank Gonzalez
Attorney, Agent, or Firm—Cushman, Darby & Cushman

[57] ABSTRACT

The invention concerns an optical guiding structure comprising, between two optical confinement layers, an optical guiding layer and an optical guiding element separated from each other by a layer for stopping chemical attack, to obtain by epitaxy methods and by chemical attack, a guiding element of which it is possible to precisely calibrate the thickness obtain surfaces of excellent quality and perform cutting out with sharpness, the invention being applicable to producing lasers and optical phase modulators.

25 Claims, 8 Drawing Sheets

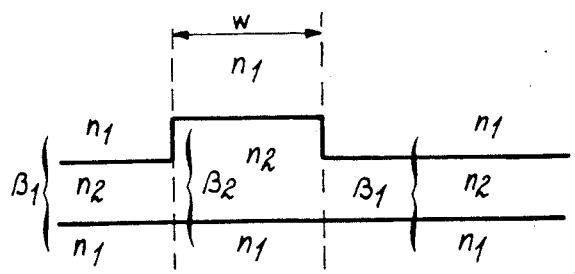
FIG_1 (PRIOR ART)
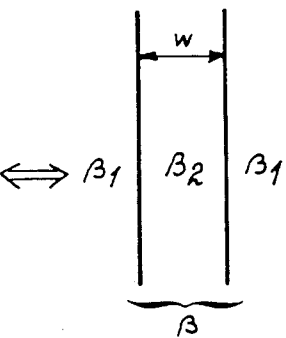
FIG_2 (PRIOR ART)
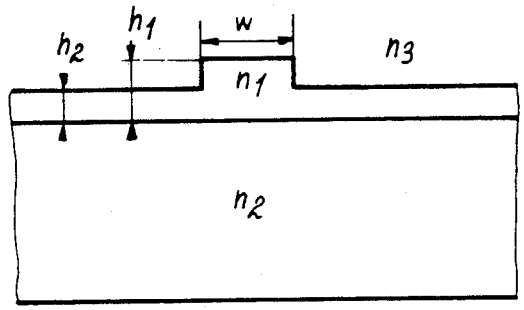
FIG_3 (PRIOR ART)
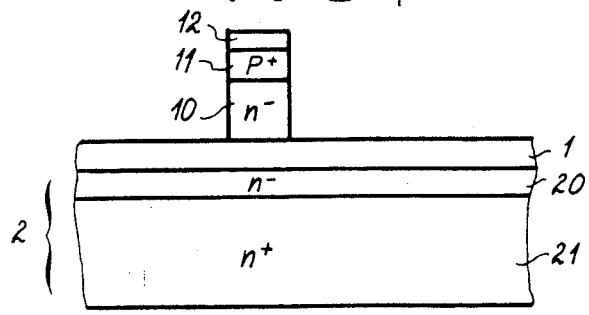
FIG_4 (PRIOR ART)

FIG_5
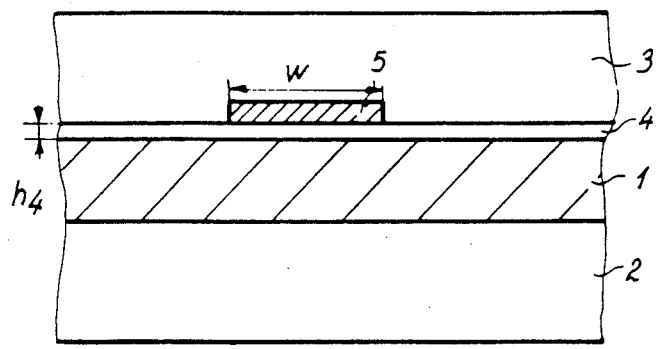
FIG_6
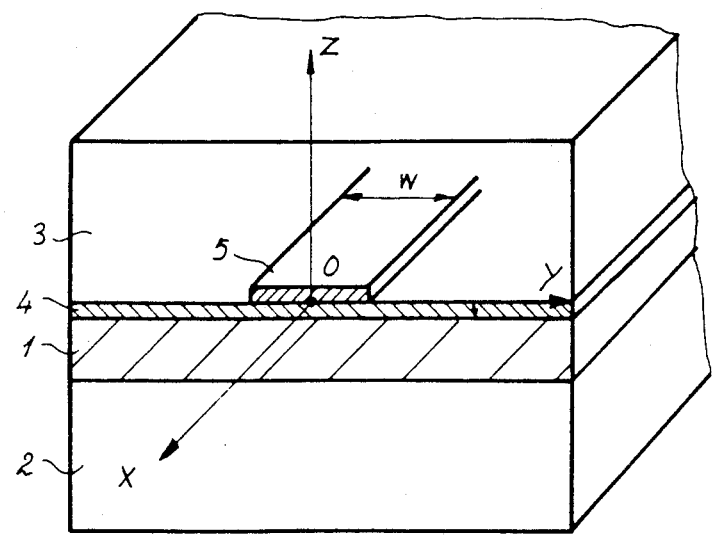

FIG_7
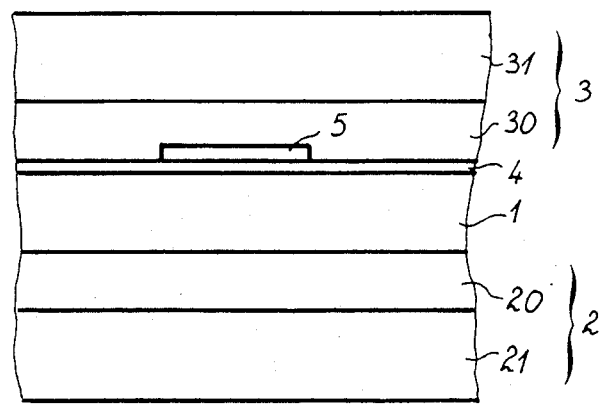
FIG_8
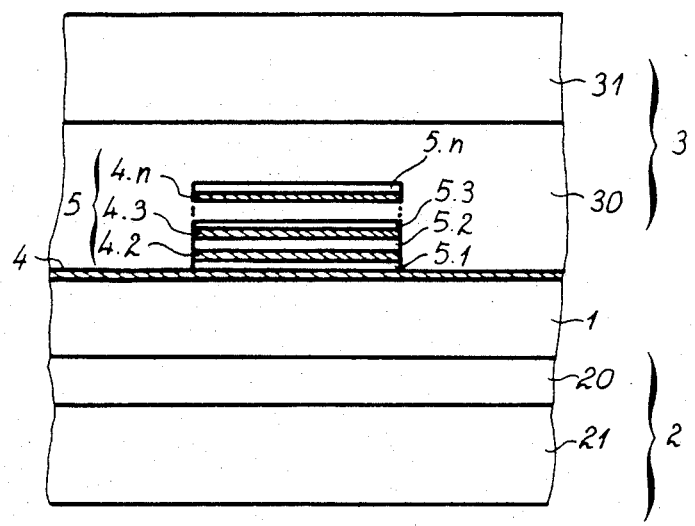

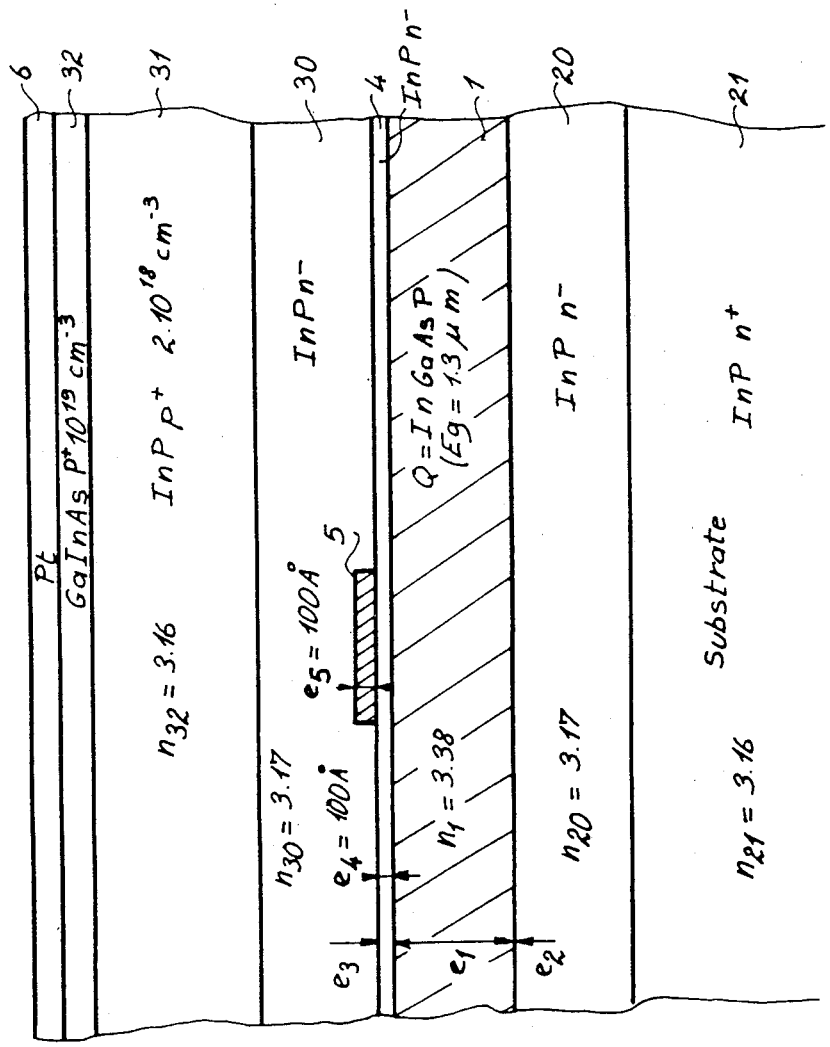
FIG_9

FIG_10
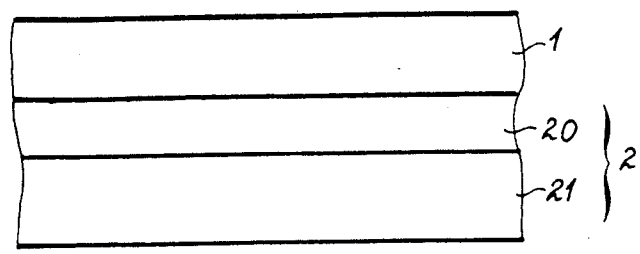
FIG_11
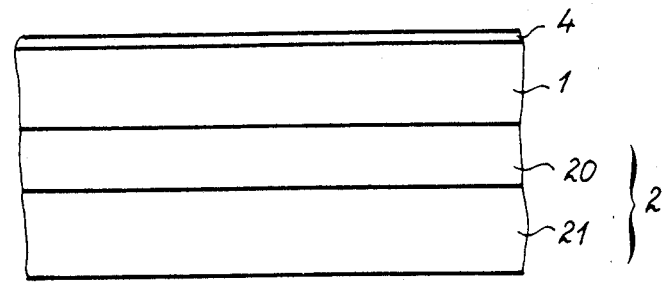
FIG_12
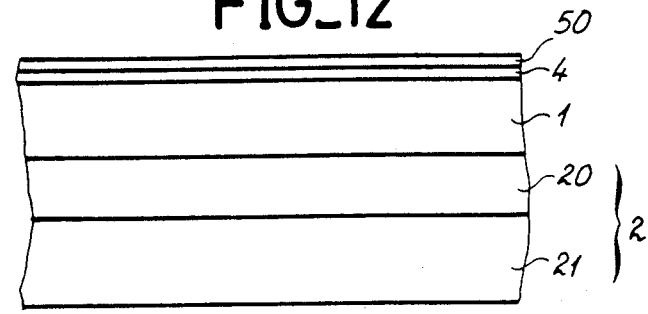
FIG_13
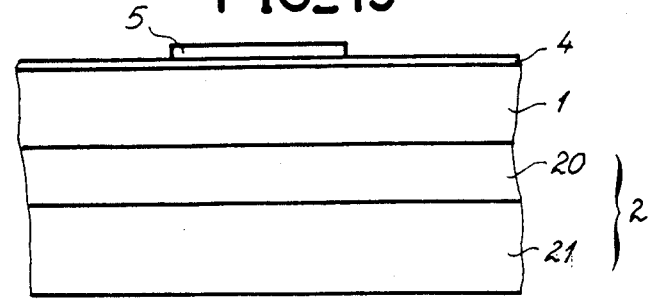

FIG_14
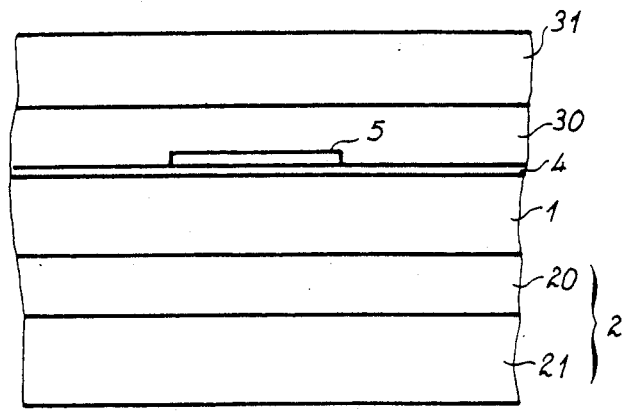
FIG_15
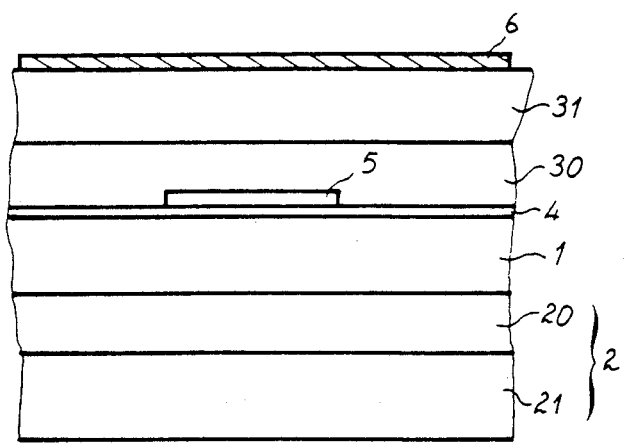

FIG_16
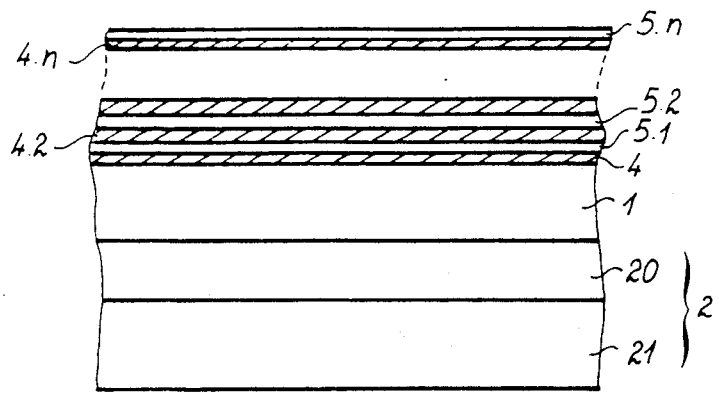
FIG_17
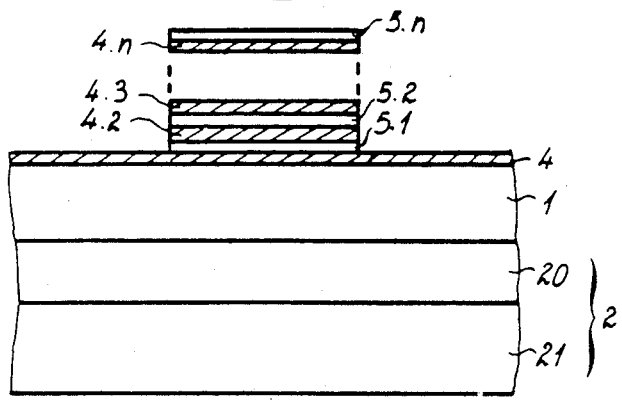
FIG_19
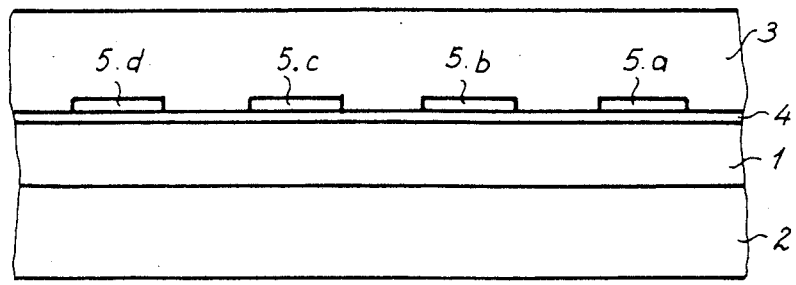

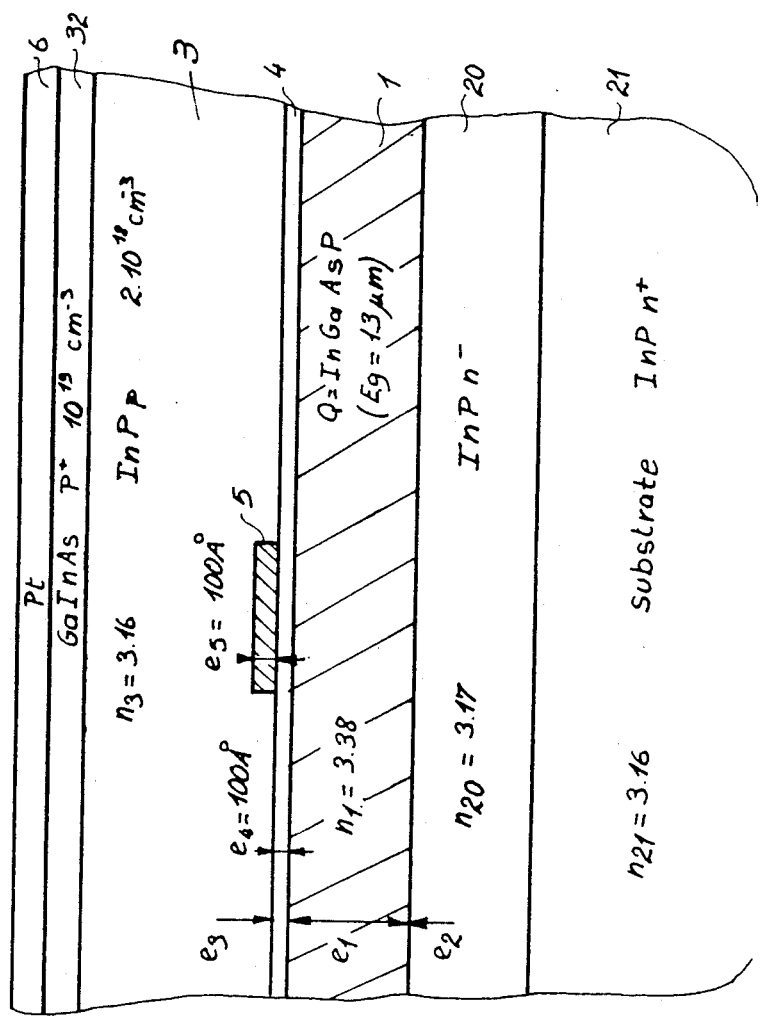
FIG_18

OPTICAL WAVEGUIDE MADE SOLID STATE MATERIAL LASER APPLYING THIS WAVEGUIDE

BACKGROUND OF THE INVENTION

1. Field of the invention

The present invention concerns an optical waveguide made of solid state material, a laser applying this waveguide and a method for carrying out the same.

2. Summary of the prior art

Solid state materials have provoked an increasing amount of interest over the past fifteen years for their noteworthy properties in optical telecommunications as light sources and detectors in the spectral field close to the infrared, in particular where the silicon optical fibers present very low attenuations and dispersions. Alongside studies aimed at rendering end components such as laser diodes and photodiodes more reliable, and offering improved performances, the possibility of better processing data by means of the integrated optics has been adopted. First of all, on passive substrates (glass), then active substrates (lithium niobate or tantalate) phase and amplitude modulating components, frequency translators or light commutators in guided medium have produced and have demonstrated the novel potential of a processing operation in the optical form of data. It is only recently that research into integrated optics on solid state materials III.V especially have allowed to envisage the integration upon a single substrate of sources, detectors, modulator components and commutators.

In the field of laser diodes, it is necessary to obtain closely controlled laser diodes and power laser diodes, even laser grid diodes. To do this, the base of a laser diode lying in a waveguide, the purpose must thus be to optimize this waveguide in order to obtain greater precision and higher power values.

It is consequently necessary to dispose of waveguides having very low losses in the solid state materials III.V produced in such a manner that it is compatible with technology currently adapted for laser diodes. Therefore, the maximum benefit of novel techniques of epitaxy and selective chemical attack of thin or ultra-thin layers (several tens of Angströms in the case of quantic wells). For example, the Low Pressure Metallorganic Chemical Vapor Deposition LP MOCVD epitaxy technology or molecular jets epitaxy MBE can be used. In order to understand the guiding method in solid state devices, it is possible to utilize, among other methods, the effective indice methods which will briefly be recalled herein-below. The guiding structure represented in FIG. 1 can be divided into three juxtapositioned plane guides each defined by a series of optogeometrical parameters. It is therefore possible to determine analytically the propagation constants of each of the plane guides taken separately when they are formed of constant index mediums $n_i$, which will always be the case for those structures currently envisaged. These propagation constants $\beta_i$ can be conceived as refraction indices of another plane guide of which it is also possible to calculate the propagation constant $\beta$. The method of effective index consists in F considering as the propagation constant of the initial structure. This method has a physical interpretation in theory of the radii when these latter are reflected at the front of different indice mediums. Everything happens therefore as if the light was confined by a medium of width w having an index $\beta_2$ and surrounded index semi infinite mediums having an index $\beta_1$ such as represented on FIG. 2.

The most simple structures that allowed to obtain the first guides in solid state or semiconductor materials have been constituted by the deposition of a thin slightly doped guiding layer on a substrate of several microns of thickness considered as infinite at the wavelengths of the infrared utilized. Such a structure is represented at FIG. 3, with the guide layer referenced 1 and the substrate referenced 2. In this case, the structure is surrounded by an upper optical confining layer which is generally air (with an index n=1) and the parameters w, h1, h2 are adjusted while being aware of the refraction indexes n1 of the guiding layer and n2 of the substrate in order to obtain the desired guiding by effective index. These structures generally present considerable losses for two reasons. First, the diffraction through the irregularities of the vertical sides of the guide can be very large due to the type of attack, on the one hand. Secondly, doped substrates are often utilized which allow to apply a control electrical field adjacent to the guide. The free carriers that are present are responsible for the attenuation of the evanescent part of the wave guided by these dielectric media.

More elaborate structures have thus been conceived and produced. They comprise optical isolating buffer layers of the guide of the strongly doped mediums. The rib type structure is thus produced by selective chemical attack of the upper buffer layer stopped on the material of the guiding layer. An example of such a structure is represented on FIG. 4. This structure comprises a substrate 21 bearing a $n^-$ doped buffer layer, which bears an optical guiding layer 1 completed by guiding elements 10 and 11 doped respectively $n^-$ and $p^+$, and which excited by an electrical field applied to a metallic electrode 12 allows a phase modulation of a luminous wave through the electrooptical effect.

By way of example, the substrate 21 and the buffer layer 20 can be made of indium phosphide (InP). The guiding layer and the guiding elements can be made of gallium and indium arsenide (GaInAs) or of Gallium and Indium arsenide phosphide (GaInAsP).

Potentially better, this structure allows with difficulty to reach losses lower than 1 or 2 dB/cm (in InP-/InGaAsP at $\lambda=1.55$ $\mu$m). If the upper confinement material of the structure is constituted by air, the guiding by effective index is strong and can raise a problem if it is desired to obtain a directional coupling since it is then necessary to move the rib guides closer to distances sometimes smaller than one micron. To reduce the guiding by effective index, it is possible to leave a part of the upper buffer layer, but this is generally of about 1 micron thickness and technologically it is very difficult to obtain surface conditions minimizing the losses through diffusion. Furthermore, the benefit of the property of the surface condition that is obtained in selective chemical attack stopping on an epitaxied layer by MOCVD method in vapor phase having an excellent optical quality is lost.

This is why the invention concerns a guide structure that can be produced through associating the vapor phase epitaxy method and the selective chemical attack method.

The vapor phase epitaxy method allows to obtain ultra thin layers allowing to reduce as desired the guiding by effective index. The selective chemical attack method allows to tool patterns on one layer without modifying the others.

The structure thus obtained is produced with a high precision on the one hand relating to the thickness of the layers and on the other hand relating to the geometry of these elements and it furthermore allows to obtain an excellent surface quality.

SUMMARY OF THE INVENTION

The invention thus concerns an optical wave guide made of solid state materials comprising at least one layer of optical guiding material of a first index comprised between at least one lower optical confinement layer of a second index and at least one upper optical confinement layer of a third index, the first index being higher than the second index and than the third index, wherein it furthermore comprises:

between the layer of optical guiding material and the upper optical confinement layer, at least one layer for stopping chemical attack, at least one optical guiding element located on the layer for stopping chemical attack, between this latter and the upper optical confinement layer, the material of this element having a chemical nature different to that of the layer stopping chemical attack and having a fourth index whose value is higher than the third index of the upper optical confinement layer.

The invention also concerns a solid state laser applying the waveguide, wherein it comprises stacked one upon the other:

a lower optical confinement layer comprising a substrate made of solid state material doped by a determined type, having a determined mesh parameter and prohibited band width;

an optical guiding layer acting as active zone, made of solid state material having a mesh parameter adapted to a multiple or sub-multiple of that of the lower optical confinement layer and of the prohibited band width lower than that of the lower optical confinement layer;

a layer for stopping chemical attack having a mesh parameter adapted to a multiple or sub-multiple of that of the optical guiding layer;

an optical guiding element having a nature chemically different to that of the layer for stopping chemical attack;

an upper optical confinement layer made of doped solid state material of the type contrary to that of the lower optical confinement layer, having a mesh parameter adapted to that of the layer for stopping chemical attack and a prohibited band width greater than that of the optical guiding layer and of the optical guiding element;

at least two conducting electrodes.

Similarly, the invention concerns a method for producing a waveguide made of solid state materials and a solid state laser, wherein it comprises the following steps:

(a) a first step for producing on a substrate made of solid state material and covered with an optical confinement layer, a layer of optical guiding material of which the mesh parameter is adapted to that of the material of the substrate and of which the prohibited band width is smaller than that of the confinement layer material;

(b) a second step for producing on the optical guiding layer a layer for stopping chemical attack made of material of which the mesh parameter is adapted to that of the material of the optical guiding layer;

(c) a third step for producing on the layer for stopping chemical attack a layer of optical guiding material of which the mesh parameter is adapted to that of the material of the layer for stopping chemical attack;

(d) a fourth chemical attack step of the optical guiding material layer by means of a product having no action on the layer for stopping chemical attack so as to produce an optical guiding element;

(e) a fifth step for producting on the optical guiding element and on the layer for stopping chemical attack not covered by this element, an upper optical confinement layer made of solid state material having a mesh parameter adapted to those of the optical guiding element and of the layer for stopping chemical attack and having an energy band greater than that of the optical guiding element and of the optical guiding layer.

BRIEF DESCRIPTION OF THE DRAWINGS

The different objects, aims and features of the invention will become more apparent from the following description, given by way of non-limitative illustration with reference to the appended drawing which represent:

FIGS. 1 and 2, explanatory diagrams of waveguides known in the prior art;

FIG. 3, an embodiment of a ribbed waveguide structure according to the prior art;

FIG. 4, an embodiment of a solid state phase modulator working through electrooptics according to the prior art;

FIG. 5, an embodiment of a solid state waveguide according to the invention;

FIG. 6, a perspective view of the solid state waveguide on FIG. 5;

FIG. 7, an alternative of the solid state waveguide represented on FIG. 5;

FIG. 8, another alternative of the solid state waveguide in which the optical guiding element comprises several layers;

FIG. 9, an embodiment of a solid state phase modulator applying the waveguide according to the invention;

FIGS. 10 to 15, different steps of an example of the producing method according to the invention;

FIGS. 16 and 17, an example of the method according to the invention allowing to obtain the waveguide represented on FIG. 8;

FIG. 18, an embodiment of a solid state laser according to the invention;

FIG. 19, an embodiment of a grid of connected waveguides or lasers according to the invention.

DESCRIPTION OF THE PREFERRED EMBODIMENTS

Waveguides produced in the form of tooled ribs in a waveguide layer exist in the prior art and have been previously described such as referred to in FIGS. 1 to 4. However, these waveguides cannot be produced with the precision and the quality required for obtaining a waveguide presenting sufficiently low propagation losses.

With reference to FIG. 5, an embodiment of a waveguide allowing to overcome these difficulties will now be described.

This waveguide structure comprises:
a lower optical confinement layer 2;
an optical guiding layer 1;
a layer for stopping chemical attack 4;
an optical guiding element 5;

an upper optical confinement layer 3.

The refraction index n1 of the optical guiding layer 1 is greater than the refraction index n2 of the lower optical confinement layer 2. It is also greater than the index n3 of the upper optical confinement layer 3. The refraction index n5 of the guiding element is higher than the index n3 of the upper optical confinement layer 3.

In these conditions, if the energy band widths as considered, the width of the energy band of a material being inversely proportional to its refraction index, the energy band widths E2 and E3 of the lower and upper optical confinement layers materials are each greater than the energy band width E1 of the optical guiding layer 1 as well as the energy band width E5 of the optical guiding element.

The layer for stopping chemical attack 4 has a chemical nature different from that of the optical guiding element 5. This allows optical guiding element 5 to be attacked by chemical agents that do not attack the layer for stopping chemical attack 4.

The thickness of the layer for stopping chemical attack 4 has a negligible thickness compared to the operating wavelength of the waveguide, which wavelength is determined by the nature of the material constituting the optical guiding layer 1.

By way of example, the thickness h4 of the layer for stopping chemical attack will be comprised between one tenth and one hundredth of the wavelength used. In these conditions, the presence of the layer for stopping chemical attack does not substantially impair the optical qualities of the structure.

One embodiment with a thickness layer for stopping chemical attack having a thickness of 100 Angströms in a waveguide operating at a wavelength of 1.55 μm has given good results.

The guiding through effective index in the structure represented at FIG. 5 is very low, about $10^{-4}$ for example. The optical guiding element 5 can thus have a width w which is larger than available in the prior art. This larger width causes influence of the side imperfections of element 5, and especially the rugosity of the sides to become less important. This effect becomes more pronounced as the thickness of the optical waveguide is smaller.

The width w of the optical guiding element 5 is thus a function of its thickness and it takes a maximal value according to whether the guide is to operate in transverse monomode or not. It is also possible with values different than w to obtain, for example, a bimode guide. Examples of numerical values will be given hereinbelow.

The propagation losses in such a waveguide can thus practically only be due to imperfections in the surface conditions of the layers. The embodiment that will be described herein-below allows to obtain surface conditions of layers leading to insignificant losses.

FIG. 6 represents in perspective the waveguide of FIG. 5 with the optical guiding element 5 placed along a plane xOy. The lower optical confinement layer 2, the optical guiding layer and the layer for stopping chemical attack 4 are parallel to the plane xOy and their size according to the directions in this plane are not necessarily limited. The guiding element 5 has the form of a strip directed according to the axis Ox and allows a luminous propagation along axis Ox. The upper optical confinement layer 3 covers the layer for stopping chemical attack 4 and the element 5.

The optical guiding layer 1 is made of a material of which the mesh parameter is adapted to a multiple or a sub-multiple of the lower optical confinement layer 2. The layer for stopping chemical attack 4 is made of a material whose mesh parameter is adapted to a multiple or a sub-multiple of the guiding layer 1.

Similarly, the mesh parameters of the upper optical confinement layer 3 and of the optical guiding element 3 are adapted relative to one another and are adapted to that of the layer for stopping chemical attack 4.

Taking into consideration the technical characteristics mentioned herein-above (refraction index, widths of prohibited band, mesh parameters), the materials used for a waveguide thus described can be produced for example by means of solid state compounds of groups III and V of the Periodic Table of Elements.

To facilitate manufacturing, the lower 2 and upper 3 optical confinement layers as well as the layer for stopping chemical attack 4 can have the same energy band width (E2=E3=E4) and can be produced by means of a common material. Similarly, the optical guiding layer 1 and the optical guiding element 5 can also have the same energy band width (E1=E5) and also be produced by means of a common material.

For example, the optical confinement layers 2 and 3 and the layer for stopping chemical attack can be made of an indium phosphide InP while the optical guiding layer 1 and the guiding element 5 can be made of gallium and indium arsenide (GaInAs) or gallium and indium arsenide phosphide (GaInAsP).

An optical guide made of gallium and indium arsenide phosphide operates at wavelengths of about 1 μm. With such a material for the optical guiding layer 1 and the guiding element 5, the thickness (h4) of the layer for stopping chemical attack could be advantageously of about 100 Angströms, thus allowing to avoid any harmful effect on the transmission qualities of the waveguide.

According to the embodiment represented in FIG. 7, the structure of FIGS. 5 and 6 foresees a doping for the lower optical confinement layer 2, a $n^+$ doped layer 21 and a $n^-$ doped layer 20 in contact with the optical guiding layer 1. The upper confinement layer also comprises two doped layers: a $p^+$ doped layer 31 and a $n^-$ doped layer 30 in contact with the optical guiding element 5 and the layer for stopping chemical attack 4. The layers 20 and 30 constitute buffer layers.

With reference to FIG. 8, an alternative of the waveguide according to the invention will now be described. FIG. 8 again shows the different layers of FIG. 7. However, the optical guiding element 5 is differently obtained. In fact, it comprises several sub-layers. On the layer for stopping chemical attack 4, it comprises a sub-layer 5.1 made of an optical guiding material, then a sub-layer for stopping chemical attack 4.2. These sub-layers are themselves covered by an alternation of sub-layers made of optical guiding material 5.2 to 5.n and of sub-layers for stopping chemical attack 4.3 to 4.n. These different sub-layers are of materials whose mesh-parameter is adapted to the mesh parameters of the adjacent sub-layers and, for the end sub-layers 5.1 and 5.n, adapted to the material of the layer for stopping chemical attack 4 (for the sub-layer 5.1) and to the material of the upper optical confinement layer 3 (for the sub-layer 5.n).

The refraction indexes of the sub-layers for stopping chemical attack 4.2 to 4.n and the refraction indexes of the optical guiding sub-layers 5.1 to 5.n are such that a guiding by effective index is performed in the structure represented on FIG. 8.

To facilitate manufacturing, the layers for stopping chemical attack 4.2 to 4.n can be produced with the same material as the layer for stopping chemical attack 4. Furthermore, the optical guiding sublayers 5.1 to 5.n can be the same as that used in the preceding description for the optical guiding layer 5.

With reference to FIG. 9, a phase modulator applying the waveguide according to the invention will now be described.

FIG. 9 also represents the lower optical confinement layers 20 and 21 respectively doped $n^-$ and $n^+$, the optical guiding layer 1, the layer for stopping chemical attack 4, the optical guiding element 5 and the upper optical confinement layers 30 and 31 respectively doped $n^-$ and $p^+$. On the upper portion of the confinement layer 31, is moreover located a metallic electrode 6 allowing to apply an electrical field and thus obtain a phase shifting.

With reference to FIG. 18, a solid state laser using a waveguide structure similar to that described hereinabove will now be described.

This figure shows the confinement layer 2 comprising lower optical trapping layers 21 and 20 respectively doped $n^+$ and $n^-$, the optical guiding layer 1, the layer for stopping chemical attack 4, the optical guiding element 5, and the p doped upper optical confinement layer 3. Furthermore, at the upper portion of the confinement layer 3 is located a layer 32 of gallium and indium arsenide (GaInAs) acting as contact layer and a metallic electrode 6 allowing to apply an electrical field.

The type of materials constituting the different layers and the thicknesses of these layers will determine the laser type and especially the operating wavelength of the laser.

For example, to obtain a solid state laser emitting at 1.3 μm, indium phosphide will be used for the layers 2, 4, 3 and gallium and indium phosphide (GaInAsP) will be used for the optical guiding layers 1, 5.

The prohibited band width of the layers 2, 4, 3 will thus have for values $E2=E3=E4=1.35$ eV. That of the optical guiding layers 1 and 5 has for value $E1=E5=0.95$ eV.

To minimize the current threshold density, the thickness of the optical guiding layer 1 should have for value $e1=0.2$ μm. That of the confinement layers 2 and 3 each should have for value $e2=e3=1$ μm, the thickness of the layer for stopping chemical attack 4 could be about 100 Angströms.

The table compiled herein-below gives approximately in function of the thickness e5 of the optical guiding element 5, the maximal values of the width w of the optical guiding element 5 ensuring that the composite guide is transverse monomode:

| e5 | 0.01 | 0.002 | 0.04 | μm |
|---|---|---|---|---|
| w | 3.3 | 2.3 | 1.6 | μm |

According to another embodiment, to obtain a solid state laser transmitting at 1.55 μm indium phosphide will be equally used for the layers 2, 3, 4 and gallium and indium arsenide phosphide (GaInAsP) will be used for the optical guiding layers 1, 5.

As described herein-above, the prohibited band width of the layers 2, 3, 4 has thus the value $E2=E3=E4=1.35$ eV. That of the optical guiding layers 1 and 5 has the value $E1=E5$ 0.8 eV.

To minimize the threshold current density, the thickness of the optical guiding layer 1 could also have the value $e1=0.2$ μm. This value e1 will permit to have a monomode guide in the direction OZ and a good location of the electromagnetic wave in the optical guiding layer 1.

The thickness of the confinement layers 2 and 3 could be $e2=e3=1$ μm. The thickness of the layer for stopping chemical attack 4 will be $e4=100$ Angströms.

As in the previous example, the width w will be a function of the thickness e5.

The waveguide according to the invention and the solid state laser carrying out this waveguide can give rise to different embodiments. In particular, it is possible to produce on a single layer for stopping chemical attack 4, several optical guiding elements 5.a to 5.d such as represented on FIG. 19. In the case of a solid state laser, the emitting power will thus be increased. A laser with cavities coupled in a single mode has thus been successfully produced.

It is also possible, although this has not been represented on the figures, to combine the embodiment of FIG. 19 with that of FIG. 8. It is thus possible to obtain, on a single layer for stopping chemical attack, several optical guiding elements each constituted by sub-layers for stopping chemical attack alternated with optical guiding sub-layers.

An embodiment of the method according to the invention will now be described with reference to FIGS. 10 to 15.

According to a first step of the method on a lower optical confinement layer 2, is produced an optical guiding layer 1. The materials used for these two layers are adapted in mesh and refraction index of layer 2 is smaller than the refraction index of layer 1. Prior thereto this embodiment step can comprise obtaining on a $n^+$ doped substrate a $n^-$ doped buffer layer.

To obtain an optical guiding layer 1 of good quality and uniform thickness, it is possible to produce the layer 1 by Metalorganic Chemical Vapor Deposition (MOCVD) or by any other method such as a epitaxy by molecular jet (MBE). A structure such as that represented in FIG. 10 is thus obtained.

During a second step, represented in FIG. 11, is produced on the optical guiding layer 1, a layer for stopping chemical attack 4. These two layers are also adapted in mesh. The refraction index of the layer 4 is smaller than that of the layer 1. The thickness of this layer must be small with respect to the wavelength used of the waveguide and to have an uniform layer 4, a method such as mentioned herein-above will be used for this step.

The material used for the layer 4 will have a different chemical nature to that which will be used in the step that will follow in order not to be chemically attacked in a subsequent attack step.

During a third step, a layer of optical guiding material is produced. The material used will be adapted to the mesh of that of layer 1. However, its thickness will be determined with a great precision and an excellent uniformity. To do this, it is important to specify that the invention foresees an epitaxy that allows a uniform deposition and according to a thickness that can be determined with precision.

The structure represented in FIG. 12 is thus obtained.

During a fourth step, a chemical attack is carried out on the layer 50 previously deposited, in such a manner as to cut into this layer, one or several optical guiding elements 5.

The protection of the portion(s) of the layer 50 that must give rise to the optical guiding elements 5 is made by any masking method known according to the prior art.

The chemical product used for the chemical attack is selected so as to attack the material of layer 50 but not to attack the material of the layer 4 for stopping chemical attack.

Thus, for this method, the layer 50 having been perfectly calibrated in thickness and being relatively thin, after chemical attack, is obtained an optical guiding element 5 having an uniform thickness and the sides of which are keenly cut out.

A structure such as represented in FIG. 13 is obtained.

During a fifth step, on the optical guiding element 5 and the layer for stopping chemical attack, is produced an upper optical confinement layer 3. This layer can be produced, as herein-above, through epitaxy by carrying out as represented in FIG. 14, a buffer layer 30 and a doped layer 31 (p+ for example).

The material used for the layers 30 and 31 is adapted in mesh to the element 5 and the stopping layer 4. Its refraction index is lower than that of the guiding layer 1 and that of the element 5.

A waveguide structure is thus obtained.

To complete the structure and obtain a phase modulator or laser during a subsequent step, on the layer 31, is provided a metallic electrode 6, for example made of platinum. The obtention of such an electrode is known in the prior art and the method according to the invention allows to produce a laser.

During the method of embodiment thus described, the thickness of the different layers and the width of the optical guiding element 5 will be selected in function of the materials used, such as described hereinabove, to determine the optimal operating wave-length of the produced waveguide or laser.

With reference to FIGS. 16 and 17, an alternative of the method according to the invention will now be described.

According to this alternative, the third step previously described comprises several alternated phases for obtaining the sub-layers of guiding material 5.1 to 5.$n$ and for obtaining the sub-layers for stopping chemical attack 4.2 to 4.$n$.

As shown by FIG. 16, a stacking of guiding sub-layers 5.1 to 5.$n$ and sub-layers for stopping chemical attack 4.2 to 4.$n$ is obtained on the optical guiding layer 1.

Similarly, according to the present alternative of the method of embodiment according to the invention, it is also foreseen that the fourth step also comprises an alternated succession of chemical attack phases. These different phases use a single prior mask of the optical guiding element to be produced.

Each chemical attack phase is carried out by means of a chemical product allowing to attack either an optical guiding sub-layer (5.1 to 5.$n$) or a sub-layer for stopping chemical attack (4.2 to 4.$n$).

For facilitating carrying out this method, the material used in the phases for producing the sub-layers of guiding material 5.1 to 5.$n$ will be the same for all sub-layers. Similarly, the material used in the phases for producing the sub-layers for stopping chemical attack 4.2 to 4.$n$ will be the same as that for the layer 4 deposited during the second step.

In these conditions, it will be necessary to use two types of chemical attack using two types of chemical products, one attacking the sub-layers 5.1 to 5.$n$, the other attacking the sub-layers 4.2 to 4.$n$. Alternatively, it is possible to use one and other of the chemical products in such a manner as to attack alternately the different sublayers. The number of chemical attack phases will be noted, especially that of the attack of the sub-layers for stopping chemical attack 4.2 to 4.$n$ in such a manner as to stop the present fourth step after attack of the layer 5.1, prior to attacking the layer for stopping chemical attack.

Therefore, according to the method of the invention, it is possible to produce a guiding by effective index rendered very small; typically of about $10^{-4}$. Thus, the guiding elements can be wider and the influence of the rugosity of the attack sides on the losses, already reduced by the low potential height of the guiding elements becomes less important. Practically, the propagation losses in this structure should only be limited by the surface conditions between the different layers and values of about several tenths of dB/cm should be obtained. This sunken structure presents another advantage if interest is paid to the hyperfrequency modulation of an integrated optical component as a directional coupling device. It is known that its control voltage will be minimal if it presents a coupling length in the interaction length, which thus fixes the space between the guides. It is also known that it will be necessary to use progressive wave electrodes of which the characteristic impedance will fix the inter electrode space. It will be understood that it will be much more difficult in the "ribbed" structure, represented in FIGS. 1 to 4, to meet the two conditions that in that where it is specified that a certain positioning latitude of the electrodes is allowable. It should furthermore be stressed that the problem of taking up the electric contact disappears whereas this was not the case in a "ribbed" structure. In fact, the too strong guiding by effective index allowed only small guide widths ($\sim 3$ $\mu$m) in order to remain monomode. Weld a wire on a rib of this width is absolutely impossible, and it is necessary to use for example the deposit of a generally thick layer (several microns) of insulating resin up to the eighth of the rib forming the guide then to that of a gold layer shifting the contact with the platinum onto reasonable surfaces in order to be able to weld gold wires.

The invention thus described also allows to obtain a laser structure in solid state materials that is compatible with that used in the integrated optics using the quality of the ultra thin layers obtained through epitaxy in vapor phase MOCVD or other method and their high-precision tooling by selective chemical attack solutions. This structure possesses potentially very low losses by diffusion for light propagation and thus constitutes a major advantage in producing very high performance integrated optoelectronic components.

It is obvious that the different numerical examples and chemical compositions have been given by way of non-limitative example to illustrate the description, and that other examples can be selected giving rise to other embodiments and applications of the invention. The methods for obtaining the layers as well as that for the attack of the layer for stopping chemical attack can utilize methods other than those indicated herein-above.

We claim:

1. Optical waveguide made of solid state materials and adapted to operate at an operating wavelength comprising:
   at least one layer of optical guiding material having a first index, and being in a plane x O y defined between three points x, O and y;
   at least one lower optical confinement layer below the optical guiding material layer, having a second index, and being extending along a plane parallel to the plane xOy and covered by said layer of optical guiding material;
   at least one layer for stopping chemical attack completely covering the layer of optical guiding material;
   at least one optical guiding element located on said layer for stopping chemical attack, and covering only part of said layer for stopping chemical attack, a material of the optical guiding element having a chemical nature different than that of the layer for stopping chemical attack and having a fourth index, the thickness of optical guiding element being smaller than few tenths of said operating wavelength of said waveguide; and
   at least one upper optical confinement layer above the optical guiding material, having a third index, completely covering said optical guiding element and the layer for stopping chemical attack in the portions where it is not covered by the optical guiding element;
   the first index being higher than the second index and then the third index, the fourth index being higher than the third index.

2. Optical waveguide made of solid state material according to claim 1, wherein the thickness of the layer for stopping chemical attack is between one tenth and a one hundredth of said wavelength of the waveguide, so that the layer for stopping chemical attack does not influence the optical qualities of the waveguide.

3. Optical waveguide made of solid state materials according to claim 1, wherein the fourth index of said optical guiding element is substantially equal to the first index of the optical guiding layer.

4. Optical waveguide made of solid state materials according to claim 1, wherein the layer for stopping chemical attack has a thickness smaller than one tenth of the value of the waveguide operating wavelength.

5. Optical waveguide made of solid state materials according to claim 1, wherein the lower optical confinement layer, the layer for stopping chemical attack, the upper optical confinement layer, the optical guiding layer, and the optical guiding element have prohibited bandwidths equal respectively to a first value, a second value, a third value, a fourth value, and a fifth value, each of the first three values being higher than each of the fourth and fifth values taken individually.

6. Optical waveguide made of solid state materials according to claim 5, wherein the said first three values are equal.

7. Optical waveguide made of solid state materials according to claim 5, wherein the said last two values are equal.

8. Optical waveguide made of solid state materials according to claim 1 wherein the optical guiding element in the form of a band is parallel to a plane xOy defined between three points x, O, and y, wherein the optical guiding element has a width along a direction Oy defined between said points O and y such that according to the refraction indexes of the different layers and of the guiding element as well as according to their thicknesses, the waveguide obtained is monomode in both the direction Oy and a direction Oz, which is perpendicular to the plane xOy, for a wave that is propagating along a direction Ox defined between the points O and x.

9. Optical waveguide made of solid state material according to claim 1, wherein the optical guiding element in the form of a band is parallel to the plane xOy defined between three points x, y, and O, wherein the optical guiding element has a width according to a direction Oy defined between the points O and y, and perpendicular to a direction Ox defined between the points O and x, so that according to the refraction indexes of the different layers and of the guiding element as well as according to their thicknesses, the waveguide obtained is bimode for a wave that is propagating along the direction Ox.

10. Optical waveguide made of solid state materials according to claim 1, wherein the guiding element has a thickness that is smaller than one hundredth of the value of the waveguide operating wavelength so as to constitute a quantic well in order to increase the absorption threshold energy of the material and thereby reduce the losses of the waveguide.

11. Optical waveguide made of solid state materials according to claim 1, comprising several guiding elements on the layer for stopping chemical attack.

12. Optical waveguide made of solid state materials according to claim 1, wherein the solid state materials utilized are compounds belonging to groups III and V of the Periodic Table of Elements.

13. Optical waveguide made of solid state materials according to claim 12, wherein the mesh parameter of each layer is adapted to a multiple or sub-multiple of mesh parameters of the adjacent layers.

14. Optical waveguide made of solid state materials according to claim 1, wherein the lower optical confinement layer comprises a $n^+$ doped substrate layer and a $n^-$ doped buffer layer, this layer being in contact with the optical guiding layer, whereas the upper confinement layer comprises, in contact with the layer for stopping chemical attack and the optical guiding element a $n^-$ doped buffer layer.

15. Optical waveguide made of solid state materials comprising:
   at least one layer of optical guiding material having a first index;
   at least one lower optical confinement layer below the optical guiding material layer and having a second index;
   at least one upper optical confinement layer above the optical guiding material and having a third index;
   the first index being higher than the second index and than the third index,
   at least one layer for stopping chemical attack between the layer of optical guiding material and the upper optical confinement layer; and
   at least one optical guiding element located on the layer for stopping chemical attack, between the layer for stopping chemical attack and the upper optical confinement layer, the material of the optical guiding element having a chemical nature different to that of the layer for stopping chemical attack and having a fourth index whose value is higher than the third index of the upper optical confinement layer, wherein the optical guiding element is in a plane xOy which is within said optical guiding element and defined between three points x, y, and O within said optical guiding element, and comprises in parallel to the plane xOy a determined number n of optical guiding sublayers, each made of a material, the index of which is higher than the third index of the upper optical confinement layer;

wherein the different optical guiding sub-layers are separated from one another by sub-layers for stopping chemical attack, each having a thickness distinctly smaller than the operating length of the waveguide.

16. Optical waveguide made of solid state materials according to claim 15, wherein each optical guiding sub-layer and each sub-layer for stopping chemical attack have each a thickness and a width of prohibited band such as defined for the optical guiding element and for the layer for stopping chemical attack.

17. Optical waveguide made of solid state materials according to claim 15, wherein the different optical guiding sub-layers are identical to one another and the different sub-layers for stopping chemical attack are identical to the layer for stopping chemical attack.

18. Optical waveguide made of solid state materials comprising:
  at least one layer of optical guiding material having a first index;
  at least one lower optical confinement layer below the optical guiding material layer and having a second index;
  at least one upper optical confinement layer above the optical guiding material and having a third index;
  the first index being higher than the second index and than the third index;
  at least one layer for stopping chemical attack between the layer of optical guiding material and the upper optical confinement layer; and
  at least one optical guiding element located on the layer for stopping chemical attack, between the layer for stopping chemical attack and the upper optical confinement layer, the material of the optical guiding element having a chemical nature different from that of the layer for stopping chemical attack and having fourth index whose value is higher than the third index of the upper optical confinement layer, wherein the solid states materials utilized are compounds belonging to groups III and V of the Period Table of Elements and wherein the mesh parameter of each layer is adapted to a multiple or sub-multiple of mesh parameters of the adjacent layers, wherein the lower and upper optical confinement layers, and the least one layer for stopping chemical attack are binary compounds.

19. Optical waveguide made of solid state materials comprising:
  at least one layer of optical guiding material having a first index;
  at least one lower optical confinement layer below the optical guiding material layer and having a second index;
  at least one upper optical confinement layer above the optical guiding material and having a third index;
  the first index being higher than the second index and than the third index;
  at least one layer for stopping chemical attack, between the layer of optical guiding material and the upper optical confinement layer; and
  at least one optical guiding element located on the layer for stopping chemical attack, between the layer for stopping chemical attack and the upper optical confinement layer, the material of the optical guiding element having a chemical nature different from that of the layer for stopping chemical attack and having fourth index whose value is higher than the third index of the upper optical confinement layer, wherein the solid state materials utilized are compounds belonging to groups III and V of the Period Table of Elements and wherein the mesh parameter of each layer is adapted to a multiple or sub-multiple of mesh parameters of the adjacent layers, wherein the at least one optical guiding layer is ternary or quarternary compounds.

20. Optical waveguide made of solid state materials according to claim 18, wherein the upper and lower optical confinement layers as well as all of the at least one layer for stopping chemical attack, are made of identical material.

21. Optical waveguide made of solid state materials according to claim 19, wherein the optical guiding layer are made of the same material.

22. Optical waveguide made of solid state materials according to claim 20, wherein the upper and lower optical confinement layers and the at least one layer for stopping chemical attack are made of indium phosphide (InP).

23. Optical waveguide made of solid state materials according to claim 21, wherein the optical guiding layer are made of gallium and indium arsenide (InGaAs) or of gallium and indium arsenide phosphide (InGaAsP).

24. Solid state laser which operates using a resonant cavity comprising, stacked one upon the other:
  a lower optical confinement layer deposited on a substrate made of doped solid state material of a determined type, having a determined lattice parameter and energy band gap, having a second index and being extended along a plane parallel to a plane xOy defined between three points x, O and y;
  an optical guiding layer acting as an active zone, made of a solid state material having a first index, having a lattice parameter adapted to a multiple or sub-multiple of said lattice parameter of the lower optical confinement layer and having an energy band gap lower than that of the lower optical confinement layer, and covering the lower optical confinement layer;
  a layer for stopping chemical etching having a lattice parameter adapted to a multiple or sub-multiple of said lattice parameter of the optical guiding layer, and covering the optical guiding layer;
  at least one optical guiding element located on said layer for stopping chemical etching, and covering only part of said layer for stopping chemical etching, a material of the optical guiding element having a chemical nature different than that of the layer for stopping chemical etching and having a fourth index, the thickness of optical guiding element being smaller than a few tenths of said an operating wavelength of said solid state laser;
  at least one upper optical confinement layer above the optical guiding element, having a third index, completely covering said optical guiding element and the layer for stopping chemical etching in the portions where it is not covered by the optical guiding element, said at least one upper optical confinement layer being made of a doped solid state material of a type contrary to that of the lower optical confinement layer, having a lattice parameter adapted to that of the layer for stopping chemical etching and an energy band gap greater than that of the optical guiding layer and of the optical guiding element;

at least two conducting electrodes with which carriers can be injected, one of them being located above the upper optical confinement and the other being located below the lower optical confinement layer;

the first index being higher than the second index and than the third index, the fourth index being higher than the third index.

25. Solid state laser according to claim 24, wherein the lower optical confinement layer of the solid state laser also comprises, between the substrate and the optical guiding layer, a buffer layer made of a same material as the substrate but more slightly doped.

* * * * *